(12) United States Patent
Chevallier et al.

(10) Patent No.: US 6,181,207 B1
(45) Date of Patent: Jan. 30, 2001

(54) CURRENT AMPLIFIER HAVING A LOW INPUT IMPEDANCE

(75) Inventors: Gilles Chevallier, Langrune/Mer (FR); Eduard F. Stikvoort, Eindhoven (NL)

(73) Assignee: U.S. Philips Corporation, New York, NY (US)

( * ) Notice: Under 35 U.S.C. 154(b), the term of this patent shall be extended for 0 days.

(21) Appl. No.: 09/425,656

(22) Filed: Oct. 22, 1999

(30) Foreign Application Priority Data

Oct. 27, 1998 (FR) ................................... 98 13436

(51) Int. Cl.$^7$ ............................. H03F 1/38; H03F 3/45; H03F 3/04; H04B 1/18
(52) U.S. Cl. ........................ 330/291; 330/252; 330/260; 330/305; 455/150.1
(58) Field of Search ................................. 330/252, 260, 330/291, 305; 455/150.1

(56) References Cited

U.S. PATENT DOCUMENTS

| | | | |
|---|---|---|---|
| 3,571,625 | * 3/1971 | Braun et al. | 33/252 |
| 3,969,682 | * 7/1976 | Rossum | 330/291 |
| 4,547,744 | * 10/1985 | Kasperkovitz | 330/252 |
| 4,904,952 | * 2/1990 | Tanimoto | 330/252 |
| 6,100,758 | * 8/2000 | Klemmer | 330/252 |

* cited by examiner

*Primary Examiner*—Benny Lee
*Assistant Examiner*—Patricia T. Nguyen
(74) *Attorney, Agent, or Firm*—Steven R. Biren

(57) ABSTRACT

A current amplifier A1 includes two transistors Q1 and Q2 whose emitters are interconnected via a resistor R1. The input of the current amplifier is constituted by the emitter of the first transistor Q1, whose collector is connected to the output terminal of the amplifier A1 via a second resistor R2, and to the first resistor R1 via the main current path of the second transistor Q2. The current amplifier A1 has a simple structure and a low input impedance, as well as an easily controllable gain.

5 Claims, 2 Drawing Sheets

CURRENT AMPLIFIER HAVING A LOW INPUT IMPEDANCE

BACKGROUND OF THE INVENTION

1. Field of the Invention

The invention relates to a current amplifier having an input terminal and an output terminal intended to receive and supply an input current and an output current, respectively, comprising a first and a second transistor each having a bias terminal, a transfer terminal and a reference terminal, the reference terminals of the first and second transistors being interconnected via a first resistor.

2. Description of the Related Art

Among multiple possible applications, such an amplifier is often used for forming an input stage, called preamplifier, within a low-noise amplifier intended to amplify a signal coming from a frequency converter in an apparatus for receiving electromagnetic signals. In the current low-noise amplifiers, the preamplifier is constituted by the first and second transistors arranged in a differential pair configuration, in which a first resistor which connects their reference terminals, then forms a degeneration resistor. If, for example, the first and second transistors are bipolar transistors, their bias terminals, transfer terminals and reference terminals will be constituted by their bases, collectors and emitters, respectively. The advantage of the known preamplifier is that its gain, defined as the ratio between the value of the AC component of the output current and that of the input current, and, consequently, the gain of the overall low-noise amplifier, can be easily controlled by adjusting the value of the first resistor. However, the known preamplifier has a high input impedance because its input terminal is constituted by the bias terminal of one of the first or second transistors. In conformity with Ohm's law, this strong input impedance induces the necessity for the frequency converter to generate a signal having a considerable voltage swing, and thus involves a strong energy consumption, which is a considerable drawback in an era in which one of the major aims of research and development in the manufacture of integrated circuits is precisely the reduction of the energy consumption in such circuits. Moreover, a high input impedance of the preamplifier induces constraints in the dimensioning of passive elements, such as inductances or capacitances, included in the frequency converter. Indeed, the nominal values of these elements should be lower as the input impedance of the amplifier is higher. The real values of these passive elements will inevitably exhibit differences with respect to their nominal values, due to imperfections related to the employed manufacturing process, which differences will influence the behavior of the frequency converter to a larger extent as the nominal values are lower. Thus, of a too high input impedance of the preamplifier may introduce unpredictabilities in the functioning of the frequency converter, which is to be prohibited.

SUMMARY OF THE INVENTION

It is an object of the invention to remedy these drawbacks to a large extent by proposing a current amplifier having an input impedance which is low in comparison with that of a known preamplifier, and whose gain can be easily controlled.

To this end, according to the invention is, a current amplifier as described in the opening paragraph characterized in that, the bias terminal of the first transistor to recieve a voltage of a predetermined value, the transfer terminal of the first transistor being connected to the output terminal of the amplifier via a second resistor, the reference terminal of the first transistor constituting the input terminal of the amplifier, the bias and transfer terminals of the second transistor being connected to the transfer terminal of the first transistor and to a positive power supply terminal, respectively.

In this current amplifier, the input terminal is constituted by the reference terminal of the first transistor, which intrinsically has an impedance which is lower than that at the bias terminal. It will hereinafter be shown that the gain of such an amplifier can be easily controlled by adjusting the values of the first and second resistors. This structure is remarkable because of its simplicity, which enables to remedy the drawbacks as described above at low manufacturing costs. Moreover, such a simplicity renders the amplifier particularly suitable for applications where the power supply voltage has a low value.

In a particular embodiment of the invention, the nominal values of the first and second resistors are substantially equal. A very considerable gain can be obtained with such a choice.

The amplifier described above has the function of amplifying current signals which are asymmetrical by nature. For reasons essentially related to the necessity of suppressing parasitic signals which may appear during frequency conversion, the frequency converter often has a symmetrical structure, generating a signal of a differential nature. The known preamplifier, constituted by a degenerated differential pair, is capable of processing such a signal. This preamplifier has then a first and a second input terminal formed by the bias terminals of the transistors constituting the differential pair, and a first and a second output terminal formed by the transfer terminals of these transistors. The input impedance of such a preamplifier, which is the impedance viewed from the bias terminals of the transistors, is large, which induces drawbacks similar to those described above.

A variant of the invention provides a current amplifier intended to amplify signals of a differential nature, this amplifier having an input impedance which is low as compared with that of the known preamplifier, and whose gain can be easily controlled.

A current amplifier in accordance with this variant of the invention has a first and a second input terminal for receiving an input current of a differential nature, and a first and a second output terminal for supplying an output current of a differential nature, comprising a first, a second, a third and a fourth transistor, each having a bias terminal, a transfer terminal and a reference terminal, the reference terminals of the first and second transistors being interconnected via a first resistor, the reference terminals of the third and fourth transistors being interconnected via a second resistor, the bias terminals of the first and third transistors to receiving a voltage of a predetermined value, the transfer terminals of the first and third transistors being, respectively, connected to the reference terminals of the fourth and second transistors, whose transfer terminals are connected to the first and second output terminals of the amplifier via a third and a fourth resistor, respectively, the reference terminals of the first and third transistors constituting the first and second input terminals of the amplifier, and the bias and transfer terminals of the second and fourth transistors being connected to the transfer and bias terminals of the fourth and second transistors, respectively.

In this current amplifier, the first and second input terminals are constituted by the reference terminals of the first and third transistors, which intrinsically have a lower impedance than that of their bias terminals. It will also be shown hereinafter that the gain of such an amplifier can be easily controlled by adjusting the values of the first, second, third and fourth resistors.

In a particular embodiment of the invention, the nominal values of the first and second resistors are substantially equal to a first nominal value, and the nominal valves of the third and fourth resistors are substantially equal to a second nominal value which is half the first nominal value. With such a choice, a very considerable gain can be obtained.

While the present invention can be used in all types of applications necessitating a current amplification, it will be advantageously used for amplifying signals which are representative of radio signals supplied by a frequency converter. The invention thus also relates to an apparatus for receiving radio signals, comprising:

an antenna and filtering system allowing reception of an electromagnetic signal whose frequency, referred to as radio frequency, is selected within a range of given frequencies, and its transformation into an electronic signal referred to as radio signal, a mixer intended to receive the radio signal and a signal from a local oscillator whose frequency, referred to as oscillation frequency, is tunable, and intended to supply an output current having a fixed frequency which is equal to the difference between the radio frequency and the oscillation frequency, and a low-noise amplifier for receiving the output current from the mixer and for supplying an amplified signal which is representative of the selected radioelectric signal, characterized in that the low-noise amplifier comprises an input stage constituted by a current amplifier as described hereinbefore.

These and other aspects of the invention are apparent from and will be elucidated, by way of non-limitative example, with reference to the embodiment(s) described hereinafter.

DESCRIPTION OF THE PREFERRED EMBODIMENTS

Figure 1:
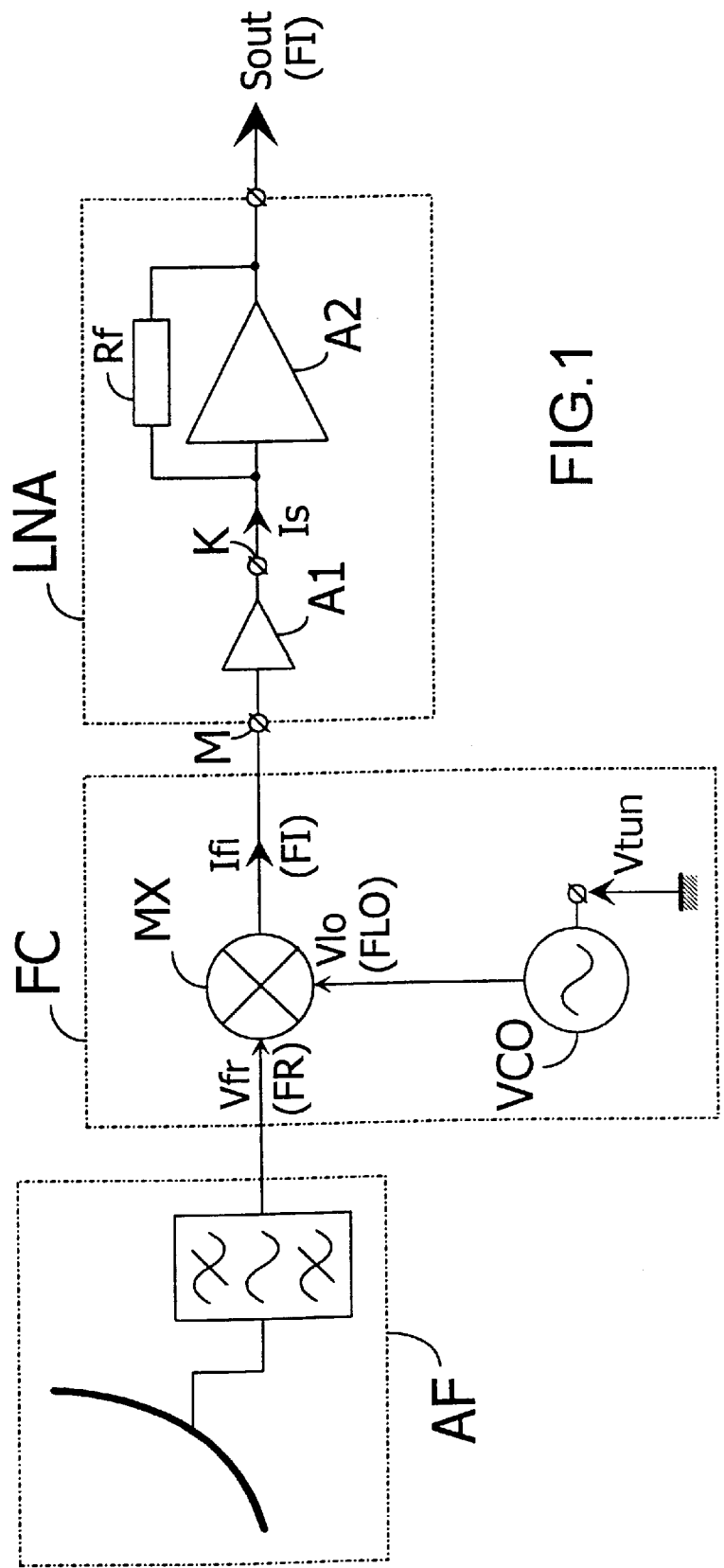
FIG. 1 is a partial functional diagram of an apparatus for receiving electromagnectic signals.

FIG. 1 shows, diagrammatically, an apparatus for receiving electromagnetic signals, comprising an antenna and filtering system AF, allowing reception of a eletromagnetic signal whose frequency FR, referred to as radio frequency, is selected within a range of given frequencies, and its transformation into an electronic signal Vfr referred to as radio signal. This receiver also comprises a frequency converter FC including a local oscillator VCO and a mixer MX which is intended to receive the radio signal Vfr and a signal Vlo from the local oscillator VCO whose frequency FLO, referred to as oscillation frequency, is tunable, and to supply an output current Ifi having a fixed frequency FI which is equal to the difference between the radio frequency FR and the oscillation frequency FLO. In this frequency converter FC, the choice of the value of the oscillation frequency FLO, effected by means of a tuning voltage Vtun, imposes the value of the radio frequency FR because the intermediate frequency FI is fixed, for example, with the aid of a filtering system (not shown) arranged at the output of the mixer MX. The output current Ifi of the mixer MX may be of an asymmetrical or differential nature, depending on the structure chosen for realizing the frequency converter FC.

The receiver shown in FIG. 1 also comprises a low-noise amplifier LNA intended to receive the output current Ifi from the mixer MX and to supply an amplified signal Sout which is representative of the selected radio signal. This amplifier LNA has an input stage, referred to as preamplifier, which is constituted by a first amplifier A1, and a second amplifier A2 which is provided, in this embodiment, with a feedback resistor Rf intended to improve the linearity of the amplification performed by the second amplifier A2. The value of this resistor Rf is determined as a function of the values of the components constituting the second amplifier A2. It is thus not desirable to modify the value of the feedback resistor Rf for adjusting the value of the gain of the low-noise amplifier LNA because the linearity of the amplification by the second amplifier A2 may be thus altered. For realizing the preamplifier 1, it is preferable to choose a structure whose gain can be easily adjusted. Moreover, the input impedance of this preamplifier A1 must be low for the double purpose of minimizing the energy consumption of the mixer MX and for ensuring the integrity of operation of the frequency converter FC.

Figure 2:
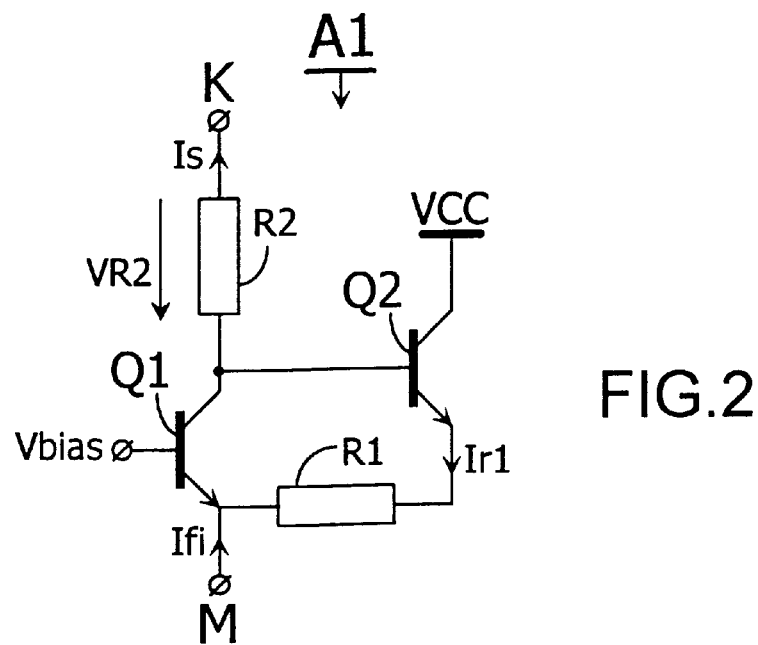
FIG. 2 is an electric circuit diagram of a current amplifier in accordance with the invention.

FIG. 2 shows an amplifier Al according to the invention, which satisfies the above-mentioned requirements. This current amplifier A1 has an input terminal M and an output terminal K for receiving and supplying an input current Ifi and an output current Is, respectively. The amplifier A1 comprises a first transistor Q1 and a second transistor Q2 each having a bias terminal, a transfer terminal and a reference terminal. The first and second transistors Q1 and Q2, being of a bipolar type in this embodiment, have their bias terminals, transfer terminals and reference terminals constituted by their bases, collectors and emitters, respectively. If, in another embodiment, the first and second transistors Q1 and Q2 had been MOS type transistors, their bias terminals, transfer terminals and reference terminals would have been constituted by their gates, drains and sources, respectively. The reference terminals of the first and second transistors Q1 and Q2 are interconnected via a first resistor R1. The bias terminal of the first transistor Q1 receives a voltage Vbias of a predetermined value, the transfer terminal of the first transistor Q1 is connected to the output terminal K of the amplifier A1 via a second resistor R2. The reference terminal of the first transistor Q1 forms the input terminal M of the amplifier A1, the bias terminal and the transfer terminal of the second transistor Q2 being connected to the transfer terminal of the first transistor Q1 and to a positive power supply terminal VCC, respectively.

The analysis of the dynamic operation of this current amplifier A1, in the hypothesis of small AC signals which is well known to those skilled in the art, may be made as follows: the node equation applied to the transfer terminal of the first transistor Q1 can be written as Is=Ifi+Ir1. When the amplifier A1 is integrated in the low-noise amplifier described above, it may be considered, in dynamic operation, that the output terminal K is connected to the circuit ground. It is thus possible to write that the voltage VR2 at the terminals of the resistor R2 is equal to R2.Is, or VR2=R2(Ifi+Ir1). The AC component of the voltage at the transfer terminal of the first transistor Q1 is reflected back at the terminals of the first resistor R1, because the AC voltages are inoperative in the hypothesis of small AC signals. Thus, we have VR2=R1.Ir1, which yields R2.Ifi+R2.Ir1=R1.Ir1, or Ir1=Ifi.R2/(R1−R2). By carrying over this expression to the one obtained in accordance with the node equation, the expression of the AC component of the output current is easily obtained: Is=Ifi.(1+R2/(R1−R2)). The gain G of the current amplifier A1 is thus expressed as G=(1+R2/(R1−R2)) and it clearly appears that its value can be easily controlled by adjusting the values of the first and second resistors R1 and R2. If one chooses nominal values which are substantially equal for these resistors R1 and R2, the difference R1−R2 will be very small and the value of the gain G will thus be very large.

Figure 3:
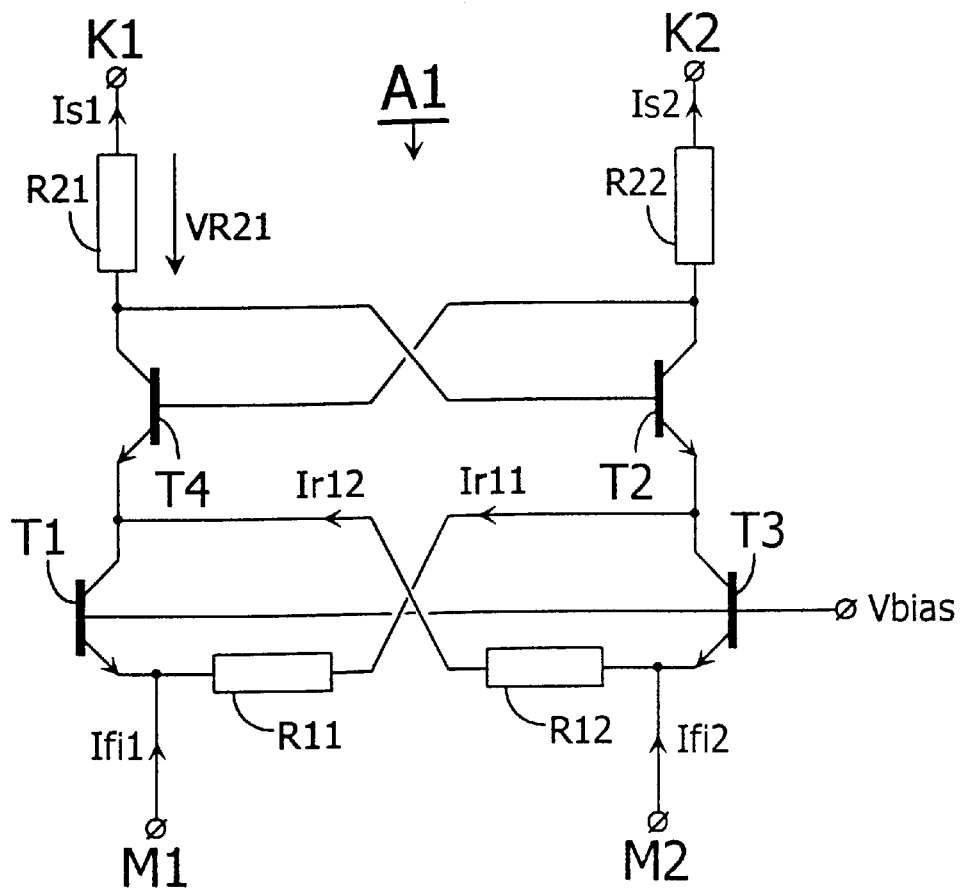
FIG. 3 is an electric circuit diagram of a current amplifier in accordance with a variant of the invention.

FIG. 3 shows an amplifier Al in accordance with a variant of the invention, constituted by two amplifiers as described above, which are interwoven so as to have a symmetrical structure. This amplifier A1 is intended to amplify a current of a differential nature while presenting a low input impedance as compared with that of a differential pair, and a gain which can be easily controlled. The use of such a variant of the invention is particularly advantageous within an apparatus for receiving radioelectric signals, comprising a frequency converter within which the mixer is provided with a symmetrical structure, for reasons essentially related to the necessity of suppressing parasitic signals which may appear during the frequency conversion, and thus generates a differential current. This amplifier A1 has a first input terminal M1 and a second input terminal M2 constituting a differential input for receiving an input current of a differential nature (Ifi1, Ifi2), the AC components of the currents Ifi1 and Ifi2 being opposed to each other. The amplifier A1 has a first output terminal K1 and a second output terminal K2 constituting a differential output for supplying an output current of a differential nature (Is1, Is2), the AC components of the currents Is1 and Is2 being opposed to each other. The amplifier A1 comprises a first transistor T1, a second transistor T2, a third transistor T3 and a fourth transistor T4, each having a bias terminal, a transfer terminal and a reference terminal. As said transistors T1, T2, T3 and T4 are of the bipolar type in this embodiment, their bias, transfer and reference terminals are constituted by their bases, collectors and emitters, respectively. The reference terminals of the first and second transistors T1 and T2 are interconnected via a first resistor R11, the reference terminals of the third and fourth transistors T3 and T4 are interconnected via a second resistor R12. The bias terminals of the first and third transistors T1 and T3 to receive a voltage Vbias of a predetermined value. The transfer terminals of the first and third transistors T1 and T3 are connected to the reference terminals of the fourth and second transistors T4 and T2, respectively, whose transfer terminals are connected to the first and second output terminals K1 and K2 of the amplifier A1 via a third resistor R21 and a fourth resistor R22, respectively. The reference terminals of the first and third transistors T1 and T3 constitute the first and second input terminals M1 and M2 of the amplifier A1. The bias and transfer terminals of the second and fourth transistors T2 and T4 are connected to the transfer and bias terminals of the fourth and second transistors T4 and T2, respectively.

The analysis of dynamic operation of this current amplifier A1, in the hypothesis of small AC signals well known to those skilled in the art, may be made as follows: with the node equation applied to the transfer terminal of the fourth transistor T4, it is possible to write Is1=Ifi1+Ir11+Ir12. When the amplifier A1 is integrated in the low-noise amplifier described above, it may be considered that, in dynamic operation, the output terminal K is connected to the circuit ground. It can then be written that the voltage VR21 at the terminals of the third resistor R21 is equal to R21.Is, or VR21=R21(Ifi1+Ir11+Ir12). Moreover, the AC component of the voltage at the transfer terminal of the fourth transistor T4 is reflected back at the terminals of the first resistor R11, because the AC voltages are inoperative in the hypothesis of small AC signals. Thus, we have VR21=R11.Ir11, which yields R21.Ifi1+R21.Ir11+R21.Ir12=R11.Ir11. For the sake of symmetry, the nominal values of the first and second resistors R11 and R12 will be chosen to be substantially equal to a first nominal value R1, and the nominal values of the third and fourth resistors R21 and R22 will be chosen to be substantially equal to a second nominal value R2, which implies that the currents Ir11 and Ir12 are equal. With this symmetry, it is possible to write Is1=Ifi1+2.Ir11, from which it follows that R2.Ifi1+2.R2.Ir11=R1.Ir11, or Ir11=Ifi.R2/(R1−2.R2). By carrying over this expression to that obtained by the node equation, the expression for the AC component of the output current is easily obtained: Is=Ifi.(1+2.R2/(R1−2.R2)). The gain G of the current amplifier A1 is thus expressed in the form G=(1+2.R2/(R1−2.R2)), and it appears clearly that its value can be easily controlled by adjusting the first and second nominal values R1 and R2. Particularly, if one adjusts these values in such a way that the second nominal value R2 is substantially equal to half the first nominal value R1, the difference R1−2.R2 will be very small and the value of the gain G will thus be very large.

What is claimed is:

1. A current amplifier having an input terminal and an output terminal for receiving and supplying an input current and an output current, respectively, comprising a first and a second transistor each having a bias terminal, a transfer terminal and a reference terminal, the reference terminals of the first and second transistors being interconnected via a first resistor, characterized in that, the bias terminal of the first transistor receives a voltage of a predetermined value, the transfer terminal of the first transistor is connected to the output terminal of the amplifier via a second resistor, the reference terminal of the first transistor constituting the input terminal of the amplifier, and the bias and transfer terminals of the second transistor being connected to the transfer terminal of the first transistor and to a positive power supply terminal, respectively.

2. The current amplifier as claimed in claim 1, characterized in that the first and second resistors have substantially equal nominal values.

3. A current amplifier having a first and a second input terminal for receiving a differential input current, and a first and a second output terminal for supplying a differential output current, said current amplifier comprising a first, a second, a third and a fourth transistor each having a bias terminal, a transfer terminal and a reference terminal, the reference terminals of the first and second transistors being interconnected via a first resistor, the reference terminals of the third and fourth transistors being interconnected via a second resistor, the bias terminals of the first and third transistors receiving a voltage of a predetermined value, the transfer terminals of the first and third transistors being respectively connected to the reference terminals of the fourth and second transistors, the transfer terminals of the fourth and second transistors being connected to the first and second output terminals of the amplifier via a third and a fourth resistor, respectively, the reference terminals of the first and third transistors constituting the first and second input terminals of the amplifier, and the bias and transfer terminals of the second and fourth transistors being connected to the transfer and bias terminals of the fourth and second transistors, respectively.

4. The current amplifier as claimed in claim 3, characterized in that the first and second resistors have nominal values substantially equal to a first nominal value, and the third and fourth resistors have nominal values substantially equal to a second nominal value, said second nominal value being half the first nominal value.

5. An apparatus for receiving radio signals, comprising:

an antenna and filtering system for receiving an electromagnetic signal having a frequency, referred to as radio frequency, selected within a range of given frequencies, and and for transforming the selected electromagnetic signal into an electronic signal referred to as radio signal;

a mixer for mixing the radio signal and a signal from a local oscillator having a tunable oscillation frequency, said mixer supplying an output current having a fixed frequency which is equal to a difference between the radio frequency and the oscillation frequency; and a low-noise amplifier for receiving the output current from the mixer and for supplying an amplified signal which is representative of the selected electromagnetic signal, characterized in that the low-noise amplifier comprises an input stage constituted by a current amplifier as claimed in claim 1.

* * * * *